United States Patent
Leipold et al.

(10) Patent No.: US 10,374,788 B2
(45) Date of Patent: Aug. 6, 2019

(54) PHASE LOCKED LOOP (PLL)-LESS MILLIMETER WAVE POWER HEAD

(71) Applicant: Qorvo US, Inc., Greensboro, NC (US)

(72) Inventors: Dirk Robert Walter Leipold, San Jose, CA (US); George Maxim, Saratoga, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/678,729

(22) Filed: Aug. 16, 2017

(65) Prior Publication Data
US 2018/0054298 A1 Feb. 22, 2018

Related U.S. Application Data

(60) Provisional application No. 62/376,118, filed on Aug. 17, 2016.

(51) Int. Cl.
| | |
|---|---|
| H03D 7/00 | (2006.01) |
| H04B 7/08 | (2006.01) |
| H04L 7/00 | (2006.01) |
| H04L 7/033 | (2006.01) |
| H04B 7/022 | (2017.01) |

(52) U.S. Cl.
CPC ............ H04L 7/0331 (2013.01); H03D 7/00 (2013.01); H04B 7/08 (2013.01); H04L 7/0087 (2013.01); H04B 7/022 (2013.01)

(58) Field of Classification Search
CPC ........ H04B 1/38; H04B 1/403; H04B 7/0413; H04B 7/08; H04L 5/0048; H04L 7/0087; H03D 7/163; H03D 7/00
See application file for complete search history.

(56) References Cited

U.S. PATENT DOCUMENTS

| | | | | |
|---|---|---|---|---|
| 5,844,939 A * | 12/1998 | Scherer | ................ | H03D 7/163 |
| | | | | 375/219 |
| 6,845,424 B2 * | 1/2005 | Casper | ................ | G06F 12/06 |
| | | | | 711/105 |
| 7,386,291 B2 * | 6/2008 | Floyd | ................ | H04B 1/30 |
| | | | | 455/205 |
| 9,705,571 B2 * | 7/2017 | Gerszberg | ................ | H04B 1/04 |
| 9,999,038 B2 * | 6/2018 | Barzegar | ................ | H04B 7/155 |
| 10,009,065 B2 * | 6/2018 | Henry | ................ | H04B 3/542 |
| 10,079,661 B2 * | 9/2018 | Gerszberg | ................ | H04L 5/0048 |

* cited by examiner

*Primary Examiner* — Khanh C Tran
(74) *Attorney, Agent, or Firm* — Withrow & Terranova, P.L.L.C.

(57) ABSTRACT

Embodiments of the disclosure relate to a phase locked loop (PLL)-less millimeter wave (mmWave) power head. The mmWave power head receives a multiplexed signal including a pilot signal at a base frequency and a communication signal at the IF frequency. The mmWave power head separates the pilot signal from the communication signal and multiplies the pilot signal to generate a local oscillator (LO) clock signal(s) at a harmonic frequency(ies) relative to the base frequency of the pilot signal. A selected LO clock signal is provided to a mixer circuit(s) for up and down conversions between the IF frequency and the mmWave carrier frequency. By eliminating the PLL frequency synthesizer from the mmWave power head, it is possible to avoid spur and coupling issues associated with collocating the PLL frequency synthesizer with an antenna front end module (FEM), thus helping to improve reliability and performance of the mmWave power head.

20 Claims, 7 Drawing Sheets

PHASE LOCKED LOOP (PLL)-LESS MILLIMETER WAVE POWER HEAD

RELATED APPLICATIONS

This application claims the benefit of provisional patent application Ser. No. 62/376,118, filed Aug. 17, 2016, the disclosure of which is hereby incorporated herein by reference in its entirety.

FIELD OF THE DISCLOSURE

The technology of the disclosure relates generally to a modem and a radio frequency (RF) front end module (FEM) for supporting millimeter wave (mmWave) communications.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation (5G) new radio (NR) (5G-NR) wireless communication system has been widely regarded as the next wireless communication standard beyond the current third-generation (3G) communication standard, such as wideband code division multiple access (WCDMA), and fourth-generation (4G) communication standard, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards. Moreover, the 5G-NR communication system is an orthogonal frequency division multiplexing (OFDM) based wireless system designed to operate across a wide range of radio frequency (RF) bands.

The United States Federal Communications Commission (FCC) published a Notice of Inquiry (NOI) in October 2014 seeking comments on several RF bands as potential RF bands for the 5G-NR communication system. The RF bands under FCC consideration include 24 GHz bands (24.25-24.45 GHz and 25.05-25.25 GHz), Local Multipoint Distribution Service (LMDS) bands (27.5-28.35 GHz, 29.1-29.25 GHz, and 31-31.3 GHz), 39 GHz bands (38.6-40 GHz), 37/42 GHz bands (37.0-38.6 GHz and 42.0-42.5 GHz), 60 GHz bands (57-64 GHz and 64-71 GHz), and 70/80 GHz bands (71-76 GHz, 81-86 GHz, and 92-95 GHz). In this regard, a 5G-NR RF baseband and front end system may be required to operate effectively across a broad millimeter wave (mmWave) spectrum.

SUMMARY

Embodiments of the disclosure relate to a phase locked loop (PLL)-less millimeter wave (mmWave) power head. In examples discussed herein, the PLL-less mmWave power head is configured to support up and down conversions between an intermediate frequency (IF) and a mmWave carrier frequency without requiring a PLL frequency synthesizer. Specifically, the mmWave power head receives a multiplexed signal including a communication signal at the IF frequency and a pilot signal at a base frequency higher than a crystal oscillator (XTAL) reference frequency. The mmWave power head separates the pilot signal from the communication signal and multiplies the pilot signal to generate a local oscillator (LO) clock signal(s) at a harmonic frequency(ies) relative to the base frequency of the pilot signal. A selected LO clock signal is provided to a mixer circuit(s) for up and down conversions between the IF frequency and the mmWave carrier frequency. By eliminating the PLL frequency synthesizer from the mmWave power head, it is possible to avoid spur and coupling issues associated with collocating the PLL frequency synthesizer with an antenna front end module (FEM), thus helping to improve reliability and performance of the mmWave power head.

In one aspect, an mmWave power head is provided. The mmWave power head includes a signal input coupled to a wired communication medium and configured to receive a multiplexed signal comprising a communication signal at an IF frequency and a pilot signal at a base frequency. The mmWave power head also includes filter circuitry coupled to the signal input and configured to demultiplex the multiplexed signal to separate the communication signal and the pilot signal. The mmWave power head also includes one or more multiplication paths configured to multiply the pilot signal to generate one or more LO clock signals at one or more harmonic frequencies relative to the base frequency of the pilot signal, respectively. The mmWave power head also includes at least one mixer circuit coupled to a selected multiplication path among the one or more multiplication paths and configured to upconvert the communication signal from the IF frequency to a mmWave carrier frequency base on a selected LO clock signal generated by the selected multiplication path.

In another aspect, a modem system is provided. The modem system includes an RF baseband circuit. The modem system also includes a plurality of mmWave power heads coupled to the RF baseband circuit via a plurality of wired communication mediums, respectively. Each mmWave power head among the plurality of mmWave power heads includes a signal input coupled to a wired communication medium among the plurality of wired communication mediums and configured to receive a multiplexed signal comprising a communication signal at an IF frequency and a pilot signal at a base frequency. Each mmWave power head among the plurality of mmWave power heads also includes filter circuitry coupled to the signal input and configured to demultiplex the multiplexed signal to separate the communication signal and the pilot signal. Each mmWave power head among the plurality of mmWave power heads also includes one or more multiplication paths configured to multiply the pilot signal to generate one or more LO clock signals at one or more harmonic frequencies relative to the base frequency of the pilot signal, respectively. Each mmWave power head among the plurality of mmWave power heads also includes at least one mixer circuit coupled to a selected multiplication path among the one or more multiplication paths and configured to upconvert the communication signal from the IF frequency to a mmWave carrier frequency base on a selected LO clock signal generated by the selected multiplication path.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
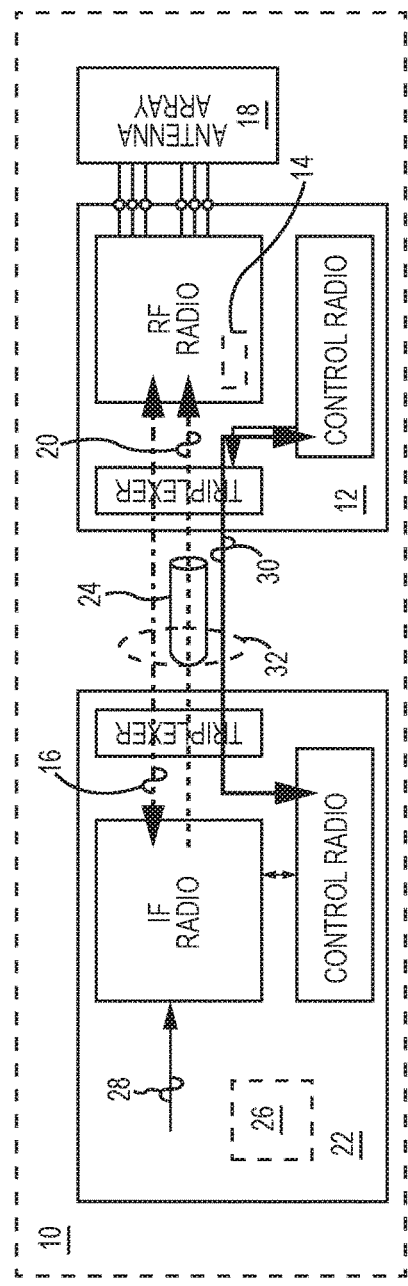
FIG. 1A is a schematic diagram of an exemplary modem system including a conventional transceiver circuit that relies on a phase locked loop (PLL) to generate a local oscillator (LO) clock signal for converting a communication signal from an IF frequency to a millimeter wave (mmWave) carrier frequency for transmission via an antenna array.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a phase locked loop (PLL)-less millimeter wave (mmWave) power head. In examples discussed herein, the PLL-less mmWave power head is configured to support up and down conversions between an intermediate frequency (IF) and a mmWave carrier frequency without requiring a PLL frequency synthesizer. Specifically, the mmWave power head receives a multiplexed signal including a communication signal at the IF frequency and a pilot signal at a base frequency higher than a crystal oscillator (XTAL) reference frequency. The mmWave power head separates the pilot signal from the communication signal and multiplies the pilot signal to generate a local oscillator (LO) clock signal(s) at a harmonic frequency(es) relative to the base frequency of the pilot signal. A selected LO clock signal is provided to a mixer circuit(s) for up and down conversions between the IF frequency and the mmWave carrier frequency. By eliminating the PLL frequency synthesizer from the mmWave power head, it is possible to avoid spur and coupling issues associated with collocating the PLL frequency synthesizer with an antenna front end module (FEM), thus helping to improve reliability and performance of the mmWave power head.

Herein, the mmWave refers to an electromagnetic spectrum (e.g., 24.25-95 GHz) allocated to a fifth-generation new radio (5G-NR) communication system(s). Accordingly, a mmWave carrier frequency refers to a radio frequency (RF) band(s) that falls within the electromagnetic spectrum of the 5G-NR communication system(s). The term 5G-NR refers to a wireless communication technology defined by the third-generation partnership project (3GPP) in long-term evolution (LTE) Release 15 (Rel-15) and beyond.

Figure 1B:
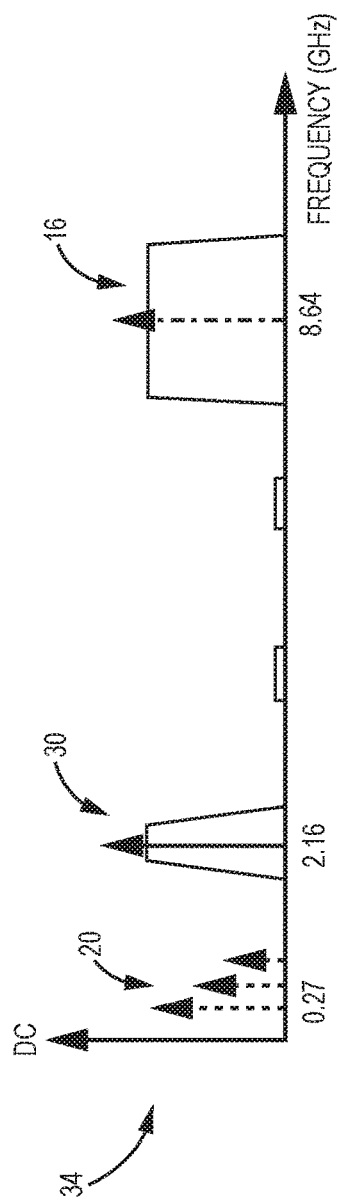
FIG. 1B is a graph providing an exemplary frequency plan for combining various signals into a multiplexed signal in the modem system of FIG. 1A.

Before discussing exemplary aspects of a PLL-less mmWave power head, a brief overview of a conventional transceiver circuit that relies on a PLL frequency synthesizer to generate an LO clock signal for frequency conversion is first provided with references to FIGS. 1A and 1B. The discussion of specific exemplary aspects of a PLL-less mmWave power head starts below with reference to FIG. 3.

FIG. 1A is a schematic diagram of an exemplary modem system 10 including a conventional transceiver circuit 12 that relies on a PLL frequency synthesizer 14 to generate a local oscillator (LO) clock signal for converting a communication signal 16 from an IF frequency to a mmWave carrier frequency for transmission via an antenna array 18. As it is well known in the field of wireless communications, a conversion from the lower IF frequency to the higher mmWave carrier frequency can be carried out by a mixer circuit base on the LO clock signal. For example, to upconvert an 8.4 GHz IF frequency to a 48 MHz mmWave carrier frequency, the LO clock signal can be provided either at 41.6 GHz frequency for a low-side injection frequency conversion or at 56.4 GHz frequency for a high-side injection frequency conversion. The LO clock signal is generated by the PLL frequency synthesizer 14 based on a crystal oscillator (XTAL) reference clock 20 that is typically running at a frequency below 300 MHz.

The conventional transceiver circuit 12 is coupled to a baseband circuit 22 via a coaxial cable 24. The baseband circuit 22 includes a crystal oscillator 26 for generating the XTAL reference clock 20. In addition, the baseband circuit 22 is configured to receive and process a baseband signal 28 to generate the communication signal 16. Further, the baseband circuit 22 also generates a control signal 30 to control the conventional transceiver circuit 12 to transmit the communication signal 16 via the antenna array 18. In this regard, the baseband circuit 22 is required to provide the communication signal 16, the XTAL reference clock 20, and the control signal 30 to the conventional transceiver circuit 12 concurrently via the coaxial cable 24. Hence, the baseband circuit 22 needs to multiplex the communication signal 16, the XTAL reference clock 20, and the control signal 30 into a multiplexed signal 32 for distribution to the conventional transceiver circuit 12 concurrently over the coaxial cable 24.

To be able to unambiguously separate the communication signal 16, the XTAL reference clock 20, and the control signal 30 at the conventional transceiver circuit 12, the communication signal 16, the XTAL reference clock 20, and the control signal 30 need to be added to the multiplexed signal 32 based on different frequencies. In this regard, FIG. 1B is a graph providing an exemplary frequency plan 34 for combining the communication signal 16, the XTAL reference clock 20, and the control signal 30 into the multiplexed signal 32 in the modem system 10 of FIG. 1A.

As mentioned earlier in FIG. 1A, the XTAL reference clock 20 is typically slower than 300 MHz. As such, the XTAL reference clock 20 needs to be located closer to a zero Hz direct current (DC) frequency, such as 270 MHz as shown in FIG. 1B. However, the control signal 30 may be originally generated in the same frequency range as the XTAL reference clock 20. As such, the control signal 30 must be upshifted from its original frequency to another frequency higher than the 270 MHz frequency occupied by the XTAL reference clock 20. For example, as shown in FIG. 1B, the control signal 30 is upshifted to a 2.16 GHz frequency. The communication signal 16, which is located at a 8.64 GHz IF frequency, is spatially separated from the XTAL reference clock 20 and the control signal 30. Thus, by allocating the XTAL reference clock 20, the control signal 30, and the communication signal 16 at 270 MHz, 2.16 GHz, and 8.64 GHz frequencies, respectively, the conventional transceiver circuit 12 would be able to separate the XTAL reference clock 20, the control signal 30, and the communication signal 16 at 270 MHz from the multiplexed signal 32. Subsequently, the conventional transceiver circuit 12 may downshift the control signal 30 back to the original frequency.

However, upshifting the control signal 30 at the baseband circuit 22 and downshifting the control signal 30 at the conventional transceiver circuit 12 can add significant processing complexity and overheads to the modem system 10. In addition, collocating the PLL frequency synthesizer 14 with the antenna array 18 can lead to significant spur and coupling issues that may compromise the accuracy of the LO clock signal. Since the PLL frequency synthesizer 14 is configured to provide phase correction to the LO clock signal based on a closed-loop feedback of the LO clock signal, the PLL frequency synthesizer 14 may potentially boost phase noise of the LO clock signal. For example, if the LO clock signal is at 28 GHz and the XTAL reference clock 20 is at 10 MHz, the PLL frequency synthesizer 14 can introduce approximately 70 dB of phase noise to the LO clock signal, thus compromising accuracy of the LO clock signal. Furthermore, the PLL frequency synthesizer 14 may generate additional heat, which can make heat dissipation a more challenging task in the modem system 10. As such, it may be desirable to overcome the deficiencies of the conventional transceiver circuit 12 by eliminating the PLL frequency synthesizer 14.

Figure 2:
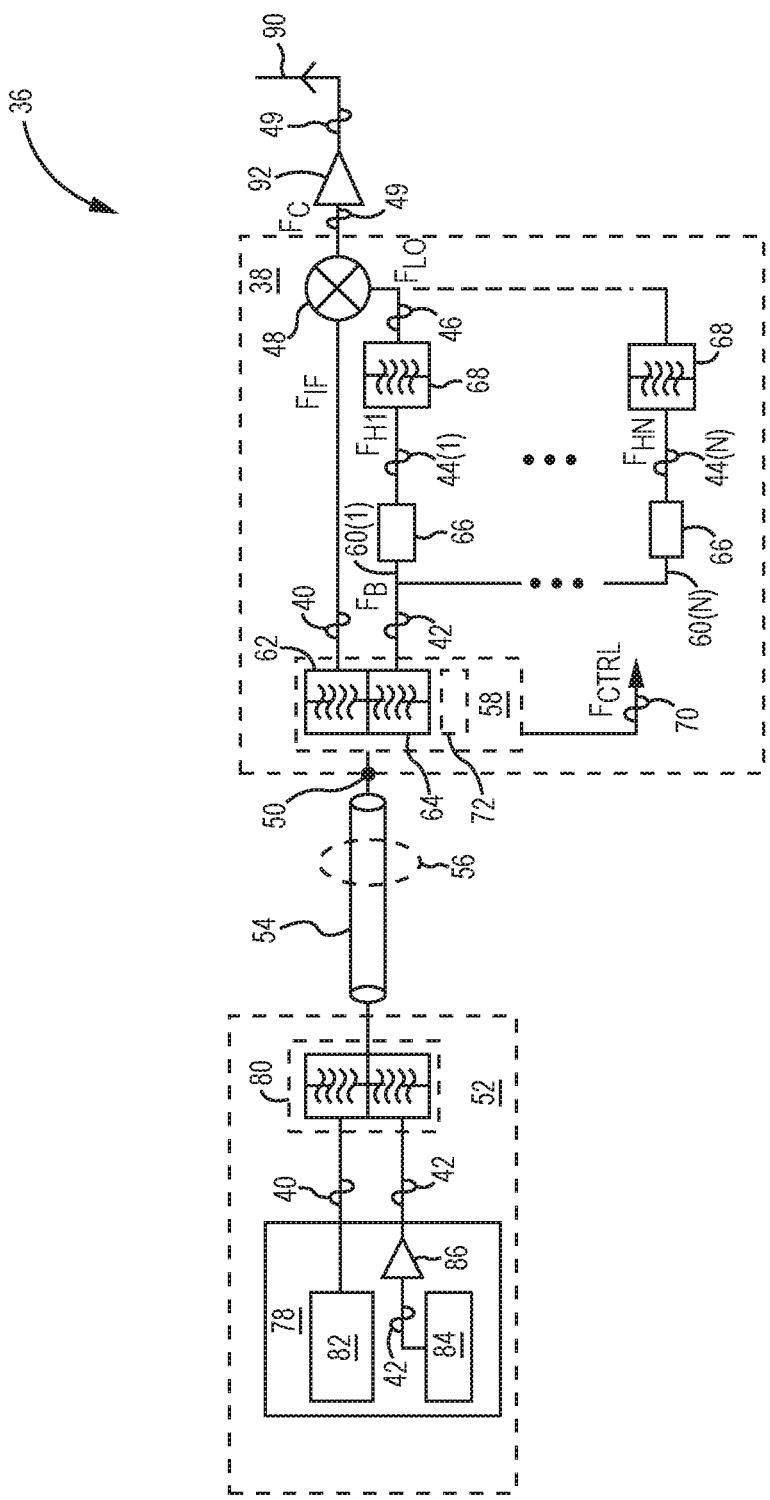
FIG. 2 is a schematic diagram of an exemplary modem system in which a mmWave power head is configured to convert a communication signal between an IF frequency and a mmWave carrier frequency without requiring a PLL frequency synthesizer being provided in the mmWave power head.

In this regard, FIG. 2 is a schematic diagram of an exemplary modem system 36 in which a mmWave power head 38 is configured to convert a communication signal 40 between an IF frequency $F_{IF}$ and a mmWave carrier frequency $F_C$ without requiring a PLL frequency synthesizer being provided in the mmWave power head 38. As such, the mmWave power head 38 is also referred to as a PLL-less mmWave power head. By eliminating the PLL frequency synthesizer (e.g., the PLL frequency synthesizer 14 of FIG. 1A) from the mmWave power head 38, the mmWave power head 38 will not need the XTAL reference clock 20 of FIG. 1A. As a result, it is no longer necessary to upshift the control signal 30 to make room for the XTAL reference clock 20 in the frequency plan 34 of FIG. 1B. Therefore, it is possible to reduce the processing complexity and overhead associated with upshifting and downshifting the control signal 30, thus making the modem system 36 more efficient. Further, by eliminating the PLL frequency synthesizer from the mmWave power head 38, it is possible to avoid the spur and coupling issues as well as heat dissipation challenges associated with collocating the PLL frequency syntheisizer with the RF FEM, thus allowing the modem system 36 to operate with improved reliability and efficiency.

As is further discussed below, the mmWave power head 38 receives and multiplies a pilot signal 42, which is at a base frequency $F_B$ at least ten times higher than the XTAL reference clock 20 of FIG. 1A, to generate one or more LO clock signals 44(1)-44(N) at one or more harmonic frequencies $F_{H1}$-$F_{HN}$ relative to the base frequency $F_B$. A selected LO clock signal 46, which can be any of the LO clock signals 44(1)-44(N), is chosen to provide a selected LO reference frequency $F_{LO}$ for use by at least one mixer circuit 48 to upconvert the communication signal 40 to generate a mmWave RF signal 49 at the mmWave carrier frequency $F_C$. In this regard, it is possible to plan and control the harmonic frequencies $F_{H1}$-$F_{HN}$ by adjusting the base frequency $F_B$ of the pilot signal 42. Further, it is possible to determine the base frequency $F_B$ based on the mmWave carrier frequency $F_C$. Thus, by selecting a proper base frequency $F_B$, it is possible for the mmWave power head 38 to generate the LO clock signals 44(1)-44(N) at the harmonic frequencies $F_{H1}$-$F_{HN}$ to upconvert the communication signal 40 to a wide range of the mmWave carrier frequency $F_C$.

In a non-limiting example, Table 1 below provides an exemplary summary of a spectral range of the mmWave carrier frequency $F_C$, to which the communication signal 40 having the IF frequency $F_{IF}$ between 3.2-4.2 GHz can be upconverted based on the pilot signal 42 at the base frequency $F_B$ between 6.4-8.4 GHz.

TABLE 1

| N | U | $F_{IF}$ (GHz) | $F_B$ (GHz) | $F_{LO}$ (GHz) | $F_C$ (GHz) |
|---|---|---|---|---|---|
| 1 | 0 | 3.2-4.2 | 6.4-8.4 | 6.4-8.4 | 6.4-8.4 |
| 3 | 1 | | | 19.2-25.2 | 22.4-29.4 |
| 5 | -1 | | | 32.0-42.0 | 28.8-37.8 |
| 5 | 1 | | | | 35.2-46.2 |
| 7 | -1 | | | 44.8-58.8 | 41.6-54.6 |
| 7 | 1 | | | | 48.0-63.0 |
| 9 | -1 | | | 57.6-75.6 | 54.4-71.4 |
| 9 | 1 | | | | 60.8-79.8 |

In Table 1, N represents an order of harmonics, and U represent a high-side injection (1) and a low-side injection (-1). For example, in the row where N=3 and U=1, the selected LO clock signal 46 provides the selected LO reference frequency $F_{LO}$ that equals the $3^{rd}$ order harmonic frequency (19.2-25.2 GHz) relative to the base frequency $F_B$. Accordingly, the mixer circuit 48 can upconvert the communication signal 40 from the IF frequency $F_{IF}$ (3.2-4.2 GHz) to the mmWave carrier frequency $F_C$ between 22.4 GHz (=19.2 GHz +3.2 GHz) and 29.4 GHz (=25.2 GHz +4.2 GHz). As shown in Table 1, by generating the selected LO clock signal 46 between the $3^{rd}$ order harmonic frequency and the $9^{th}$ order harmonic frequency relative to the base frequency $F_B$, the communication signal 40 can be upconverted to the mmWave carrier frequency FC that ranges from 22.4 GHz to 79.8 GHz.

The mmWave power head 38 includes a signal input 50 coupled to an RF baseband circuit 52 via a wired communication medium 54. In a non-limiting example, the wired communication medium 54 is a single coaxial cable for providing interconnection between the RF baseband circuit 52 and the mmWave power head 38. The mmWave power head 38 receives a multiplexed signal 56, which includes the communication signal 40 at the IF frequency $F_{IF}$ and the pilot signal 42 at the base frequency $F_B$, via the signal input 50. The mmWave power head 38 includes filter circuitry 58, which is coupled to the signal input 50, configured to receive and demultiplex the multiplexed signal 56 to separate the communication signal 40 and the pilot signal 42. The mmWave power head 38 includes one or more multiplication paths 60(1)-60(N) configured to multiply the pilot signal 42 to generate the LO clock signals 44(1)-44(N) at the harmonic frequencies $F_{H1}$-$F_{HN}$, respectively. The selected LO clock signal 46, which herein refers to the LO clock signal 44(1) at the harmonic frequency $F_{H1}$ as a non-limiting example, is routed to the mixer circuit 48 to provide the selected LO reference frequency $F_{LO}$ for upconverting the communication signal 40 from the IF frequency $F_{IF}$ to the mmWave carrier frequency $F_C$. Notably, the selected LO clock signal 46 can also be utilized by the mixer circuit 48 for downconverting the communication signal 40 from the mmWave carrier frequency $F_C$ to the IF frequency $F_{IF}$.

In a non-limiting example, the filter circuitry 58 includes a first filter 62 and a second filter 64, which can be acoustic filters such as surface acoustic wave (SAW) filters, bulk acoustic wave (BAW) filters, and/or film bulk acoustic resonator (FNAR) filters for example. The first filter 62 can be a bandpass filter configured to pass the communication signal 40 at the IF frequency $F_{IF}$ and reject the pilot signal 42 at the base frequency $F_B$. The second filter 64 can be a bandpass filter configured to pass the pilot signal 42 at the base frequency $F_B$ and reject the communication signal 40 at the IF frequency $F_F$. As such, the first filter 62 and the second filter 64 can effectively separate the pilot signal 42 from the communication signal 40.

In another non-limiting example, each of the multiplication paths 60(1)-60(N) can include a clock multiplier 66 and a bandpass filter 68. The clock multiplier 66 is configured to multiply the pilot signal 42 to generate a respective LO clock signal among the LO clock signals 44(1)-44(N) at a respective harmonic frequency among the harmonic frequencies $F_{H1}$-$F_{HN}$. For example, the clock multiplier 66 in the multiplication path 60(1) multiplies the pilot signal 42 to generate the LO clock signal 44(1) at the harmonic frequency $F_{H1}$, and the clock multiplier 66 in the multiplication path 60(N) multiplies the pilot signal 42 to generate the LO clock signal 44(N) at the harmonic frequency $F_{HN}$. The bandpass filter 68, which may be implemented by a transmission line filter, is configured to pass the respective LO clock signal while rejecting noises associated with the respective LO clock signal. In other words, the bandpass filter 68 smoothes out the respective LO clock signal by removing the spurs in the respective LO clock signal.

The multiplexed signal 56 can also include a control signal 70 at a frequency $F_{CTRL}$ that is below 300 MHz. In this regard, the filter circuitry 58 may include a third filter 72, which can be a lowpass filter to pass the control signal 70 while rejecting the communication signal 40 and the pilot signal 42. The communication signal 40, the pilot signal 42, and the control signal 70 can be multiplexed at the RF baseband circuit 52 and demultiplexed at the mmWave power head 38 based on a frequency plan as discussed next in FIG. 3.

Figure 3:
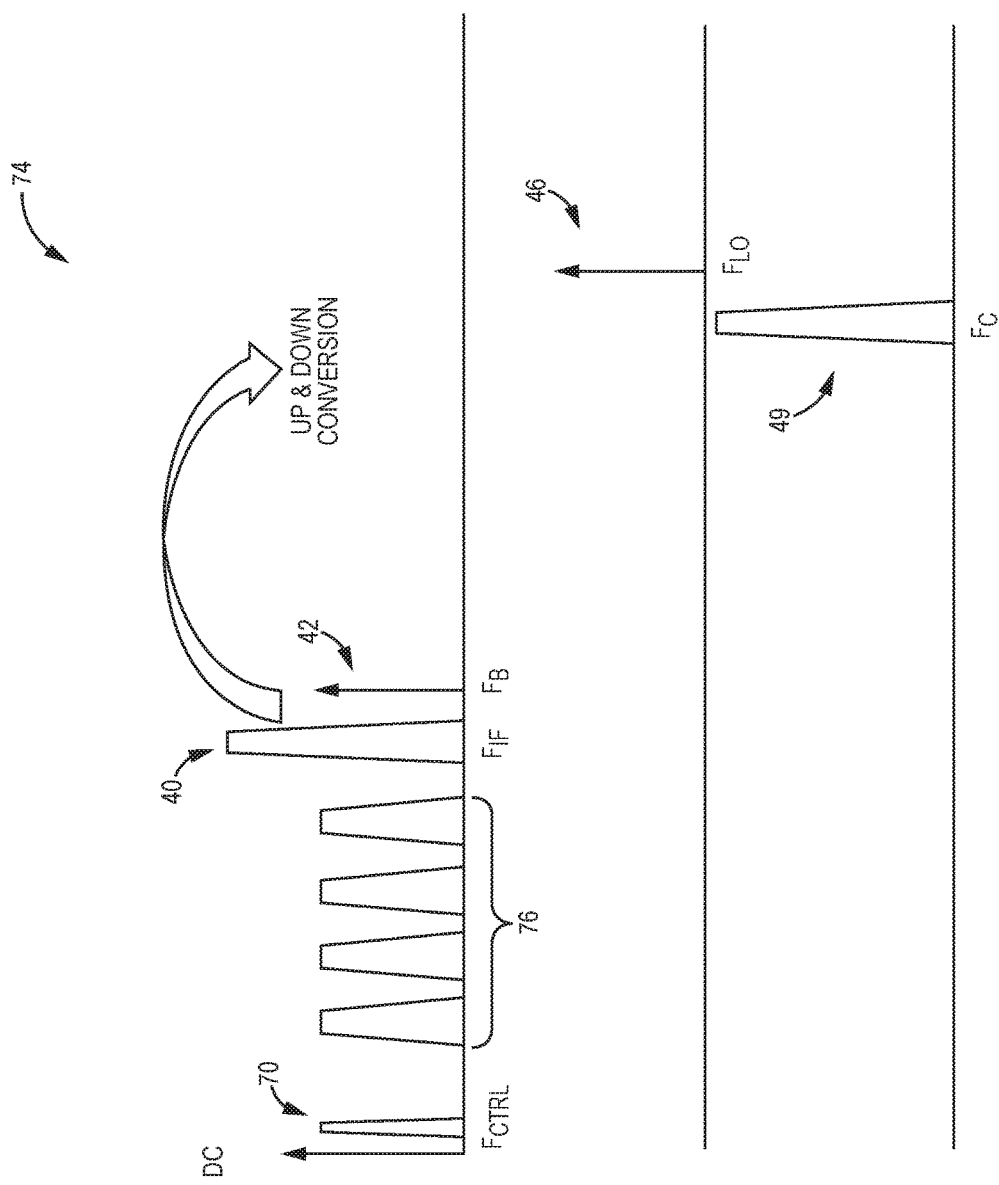
FIG. 3 is a graph providing an exemplary frequency plan for combining a communication signal, a pilot signal, and a control signal into a multiplexed signal in the modem system of FIG. 2.

In this regard, FIG. 3 is a graph providing an exemplary frequency plan 74 for combining the communication signal 40, the pilot signal 42, and the control signal 70 into the multiplexed signal 56 in the modem system 36 of FIG. 2. Common elements between FIGS. 2 and 3 are shown therein with common element numbers and will not be re-described herein.

As previously discussed, the base frequency $F_B$ of the pilot signal 42 is at least ten times higher than the XTAL reference clock at a frequency below 300 MHz. As such, the frequency $F_{CTRL}$ of the control signal 70 can be located close to the DC frequency, without being upshifted as in the modem system 10 of FIG. 1A. As shown in FIG. 3, the frequency $F_{CTRL}$ of the control signal 70, the IF frequency $F_{IF}$ of the communication signal 40, and the base frequency $F_B$ of the pilot signal 42 are non-overlapping with each other.

Notably, there can be third-generation (3G) and/or fourth-generation (4G) cellular bands 76, residing between the frequency $F_{CTRL}$ and the IF frequency $F_F$. As such, to avoid overlapping with the 3G/4G cellular bands 76, the selected multiplication path can be configured to generate the selected LO reference frequency $F_{LO}$ higher than the mmWave carrier frequency $F_C$. As such, the mmWave RF signal 49 can be generated based on a high-side injection of the selected LO clock signal 46, thus helping to avoid unintended overlapping with the 3G/4G cellular bands 76.

With reference back to FIG. 2, the RF baseband circuit 52 incudes a baseband IC 78 and a multiplexer/demultiplexer circuit 80. The baseband IC 78 includes a baseband circuit 82 and a PLL frequency synthesizer 84 configured to generate the communication signal 40 and the pilot signal 42, respectively. The pilot signal 42 may be amplified by an amplifier 86 prior to being provided to the multiplexer/demultiplexer circuit 80. The multiplexer/demultiplexer circuit 80 multiplexes the communication signal 40 and the pilot signal 42 to generate the multiplexed signal 56. The RF baseband circuit 52 then provides the multiplexed signal 56 to the mmWave power head 38 via the wired communication medium 54.

Figure 4:
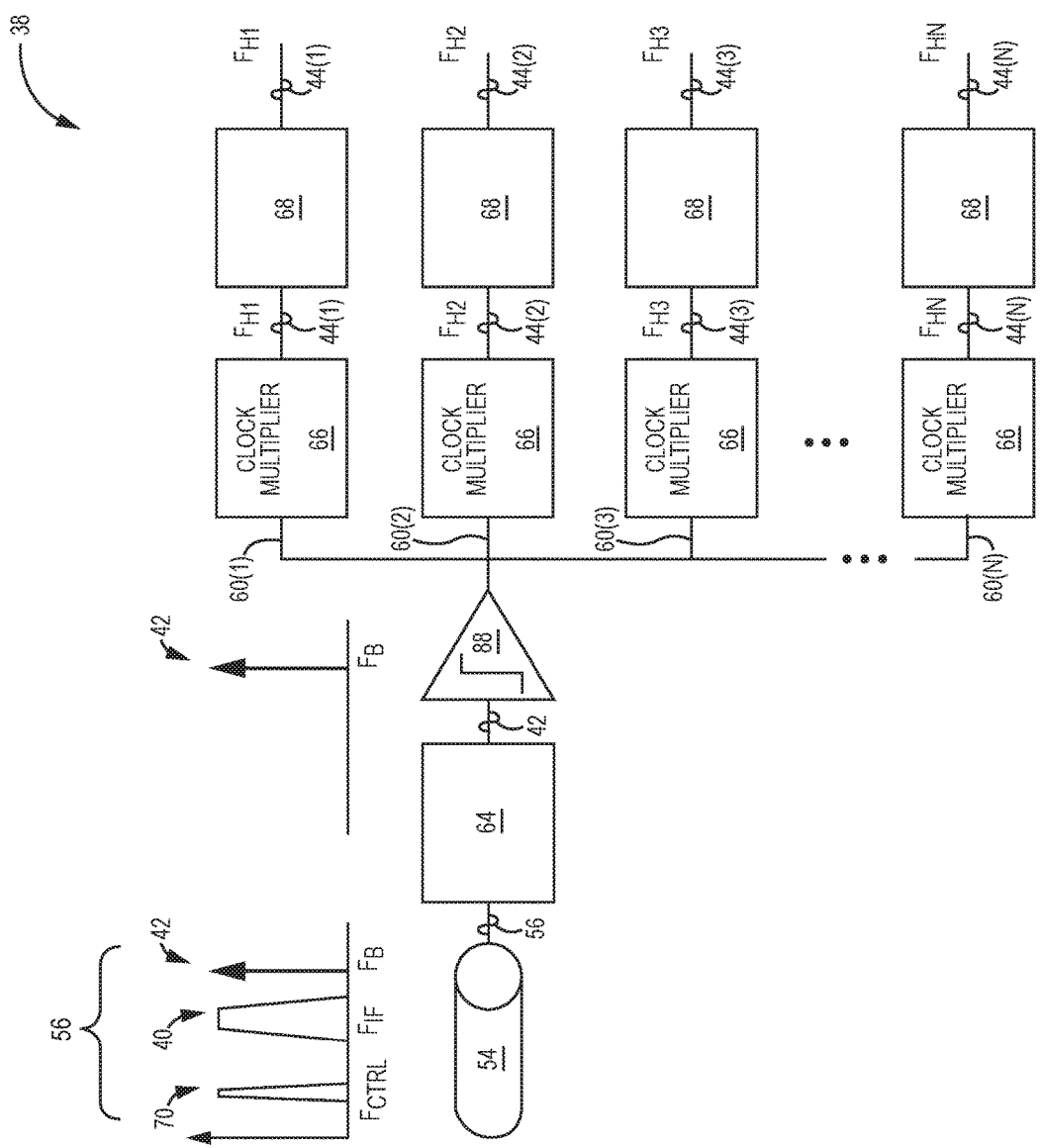
FIG. 4 is a schematic diagram providing an exemplary illustration of inner structure of one or more multiplication paths for generating one or more local oscillator (LO) clock signals in the mmWave power head of FIG. 2.

To help further understand the inner structure of the multiplication paths 60(1)-60(N) in the mmWave power head 38, FIG. 4 is discussed next. In this regard, FIG. 4 is a schematic diagram providing an exemplary illustration of an inner structure of the multiplication paths 60(1)-60(N) for generating the LO clock signals 44(1)-44(N) in the mmWave power head 38 of FIG. 2. Common elements between FIGS. 2 and 4 are shown therein with common element numbers and will not be re-described herein.

The mmWave power head 38 may include a signal shaping circuit 88 for shaping the pilot signal 42 from a sinusoidal shaped signal to a square shaped signal to help ease the multiplications performed by the clock multiplier 66 in each of the multiplication paths 60(1)-60(N). Notably, it is also possible to embed the signal shaping circuit 88 into each of the multiplication paths 60(1)-60(N).

Figure 5:
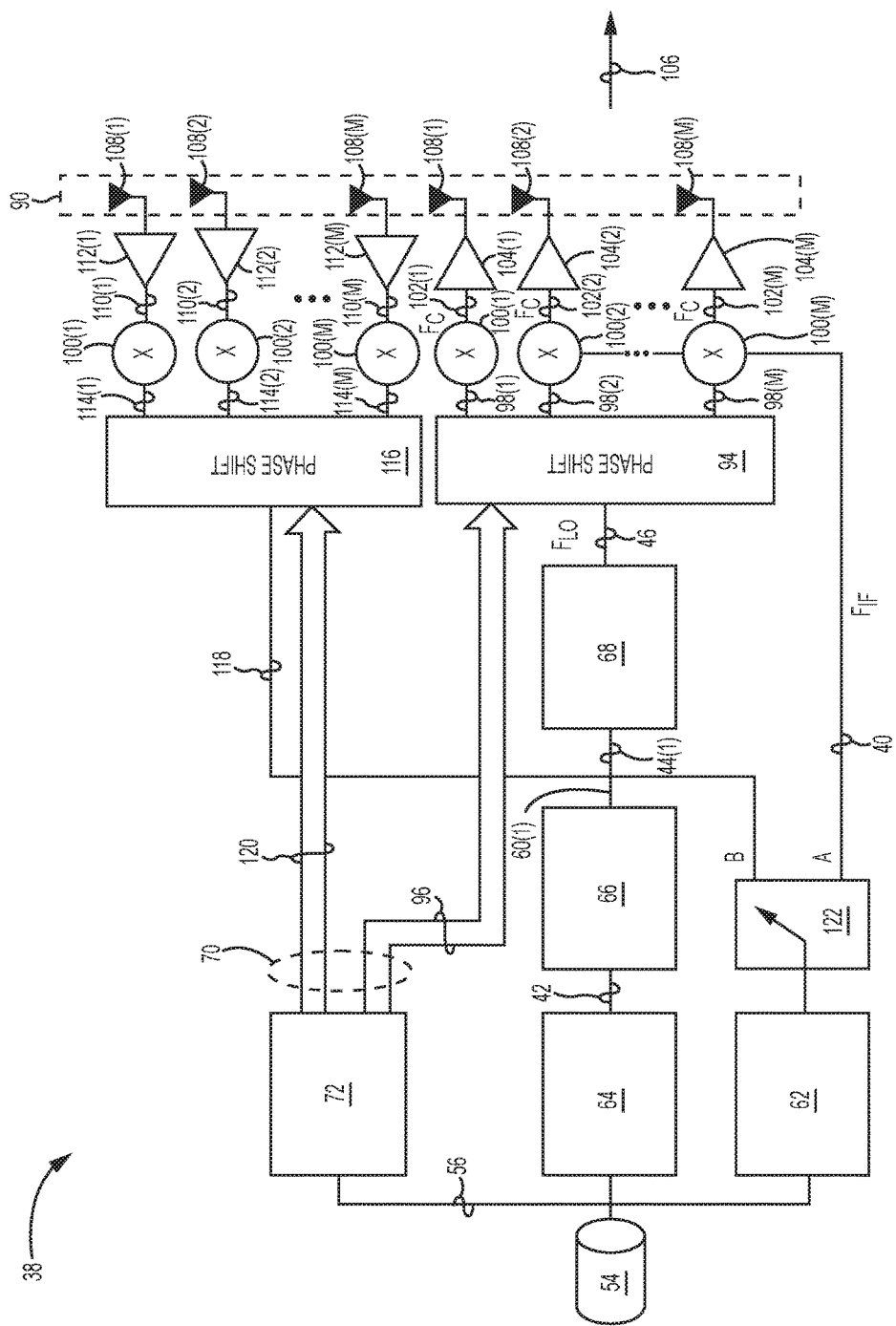
FIG. 5 is a schematic diagram of the mmWave power head of FIG. 2 configured to support mmWave beamforming.

With reference back to FIG. 2, the mmWave RF signal 49 may be transmitted from an antenna array 90 in an RF beam after being amplified by a power amplifier 92. To be able to form the RF beam from multiple antennas in the antenna array 90, it is necessary to provide multiple copies of the mmWave RF signal 49 to the multiple antennas with phase coherency. In this regard, FIG. 5 is a schematic diagram of the mmWave power head 38 of FIG. 2 configured to support mmWave beamforming. Common elements between FIGS. 2 and 5 are shown therein with common element numbers and will not be re-described herein. For the convenience of illustration and reference, the multiplication path 60(1) is discussed herein as a non-limiting example of the selected multiplication path. Accordingly, the LO clock signal 44(1) generated by the multiplication path 60(1) is referenced herein as the selected LO clock signal 46 at the selected LO reference frequency $F_{LO}$. It should be appreciated that any of the multiplication paths 60(1)-60(N) in FIG. 2 can be designated as the selected multiplication path for providing the selected LO clock signal 46 to support mmWave beamforming.

The mmWave power head 38 includes a transmit phase shifter 94 coupled to the selected multiplication path to receive the selected LO clock signal 46 at the selected LO reference frequency $F_{LO}$. The transmit phase shifter 94 is controlled by a transmit phase control signal 96, which may be received in the control signal 70, to phase shift the selected LO clock signal 46 to generate a plurality of phase-coherent LO clock signals 98(1)-98(M). The mixer circuit 48 in FIG. 2 may be replaced by a plurality of mixer circuits 100(1)-100(M). The mixer circuits 100(1)-100(M) are coupled to the transmit phase shifter 94 to receive the phase-coherent LO clock signals 98(1)-98(M). In addition, the mixer circuits 100(1)-100(M) are also configured to receive the communication signal 40 at the IF frequency $F_F$. The mixer circuits 100(1)-100(M) are configured to upconvert the communication signal 40 based on the phase-coherent LO clock signals 98(1)-98(M) to generate a plurality of phase-coherent mmWave RF signals 102(1)-102(M) at the mmWave carrier frequency $F_C$, respectively. The phase-coherent mmWave RF signals 102(1)-102(M) are amplified by a plurality of power amplifiers 104(1)-104(M) for transmission in a mmWave beam 106 from a plurality of antennas 108(1)-108(M), respectively.

The antennas 108(1)-108(M) may also receive a plurality of mmWave RF signals 110(1)-110(M), respectively. The mmWave RF signals 110(1)-110(M) may be amplified by a plurality of low-noise amplifiers (LNAs) 112(1)-112(M), respectively. The mixer circuits 100(1)-100(M) may be further configured to downconvert the mmWave RF signals 110(1)-110(M) to a plurality of phase-coherent received communication signals 114(1)-114(M), respectively. The mmWave power head 38 may include a receive phase shifter 116 configured to generate a second communication signal 118. The receive phase shifter 116 may be controlled by a receive phase control signal 120, which can be received as part of the control signal 70. The mmWave power head 38 may further include a switch 122. The switch 122 can be switched to a position A to provide the communication signal 40 to the mixer circuits 100(1)-100(M), or be switched to a position B to receive the second communication signal 118.

Figure 6:
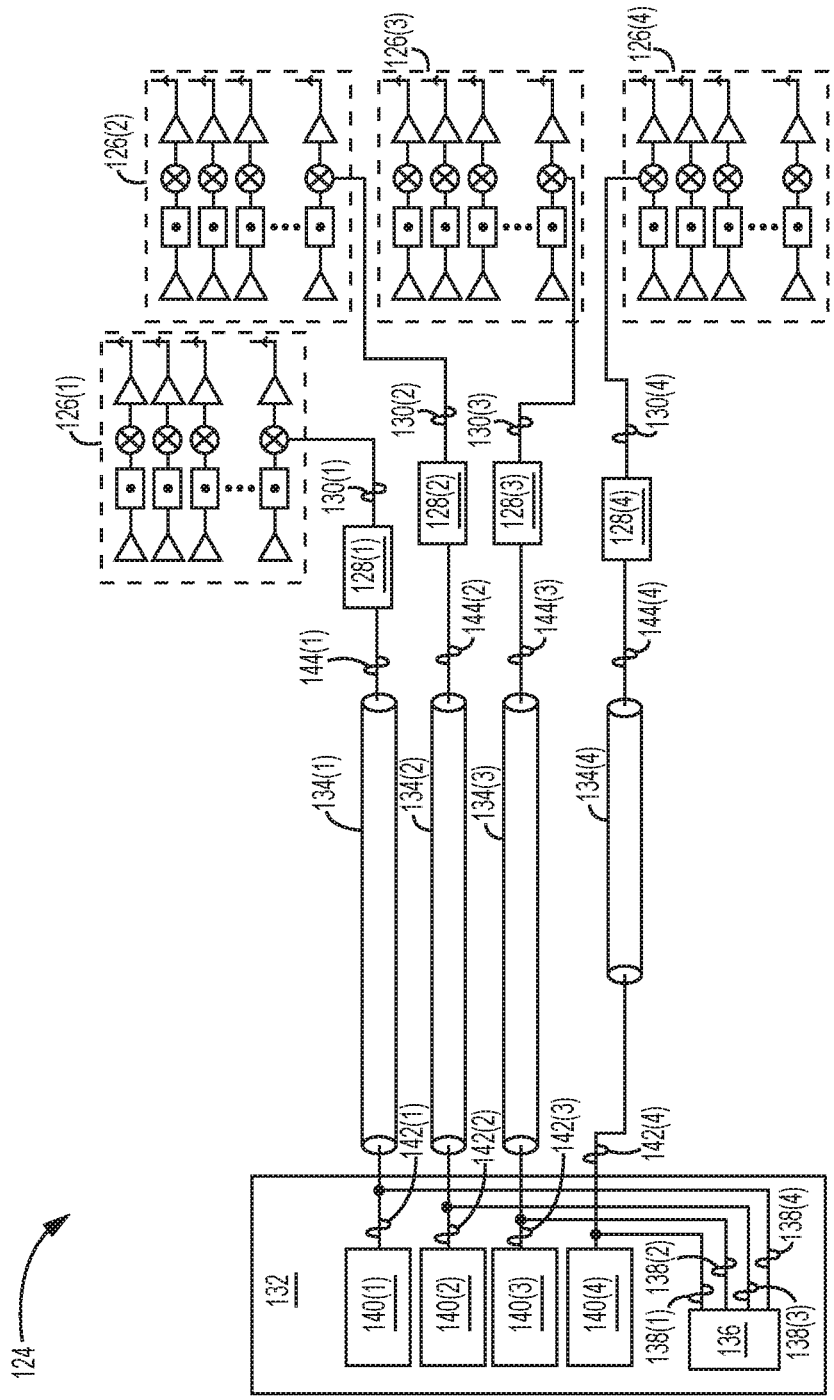
FIG. 6 is a schematic diagram of an exemplary modem system configured to support multiple mmWave RF front end subsystems by employing more than one of the mmWave power head of FIG. 2.

Notably, it is possible to include more than one of the mmWave power head 38 of FIG. 2 to support multiple mmWave RF front end subsystems. In this regard, FIG. 6 is a schematic diagram of an exemplary modem system 124 configured to support multiple mmWave RF front end subsystems 126(1)-126(4) by employing more than one of the mmWave power head 38 of FIG. 2.

The modem system 124 includes a plurality of mmWave power heads 128(1)-128(4) for providing a plurality of LO clock signals 130(1)-130(4) to the mmWave RF front end subsystems 126(1)-126(4), respectively. Each of the mmWave power heads 128(1)-128(4) is functionally equivalent to the mmWave power head 38 of FIGS. 2, 4, and 5. Although the modem system 124 is shown herein to include only the mmWave RF front end subsystems 126(1)-126(4), it should be appreciated that more mmWave RF front end subsystems can be supported by adding additional mmWave power heads.

The mmWave power heads 128(1)-128(4) are coupled to an RF baseband circuit 132 via a plurality of wired communication mediums 134(1)-134(4), respectively. Each of the wired communication mediums 134(1)-134(4) can be a coaxial cable. Notably, each of the mmWave power heads 128(1)-128(4) is coupled to the RF baseband circuit 132 by a single wired communication medium.

The RF baseband circuit 132 includes a PLL frequency synthesizer 136 configured to generate a plurality of pilot signals 138(1)-138(4). The RF baseband circuit 132 includes a plurality of baseband circuits 140(1)-140(4) for generating a plurality of communication signals 142(1)-142(4), respectively. The communication signals 142(1)-142(4) are multiplexed with the pilot signals 138(1)-138(4) to generate a plurality of multiplexed signals 144(1)-144(4), respectively. The multiplexed signals 144(1)-144(4) are communicated from the RF baseband circuit 132 to the mmWave power heads 128(1)-128(4) via the wired communication mediums 134(1)-134(4), respectively.

Notably, it is possible to include more than one of the modem system 124 of FIG. 6 in a mmWave base station. In this regard, FIG. 7 is a schematic diagram of an exemplary base station 146 employing more than one of the modem system 124 of FIG. 6.

Figure 7:
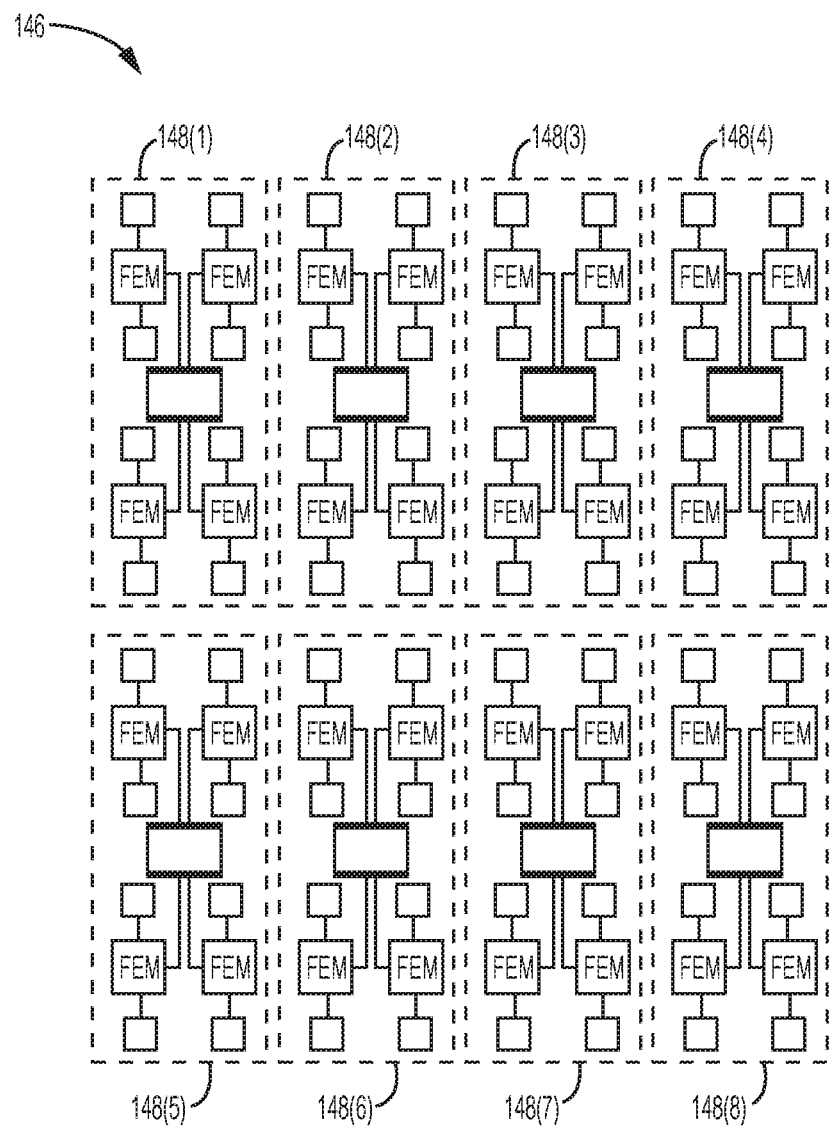
FIG. 7 is a schematic diagram of an exemplary base station employing more than one of the modem system of FIG. 6.

As shown in FIG. 7, the base station 146 is configured to include eight modem systems 148(1)-148(8). Each of the modem systems 148(1)-148(8) is functionally equivalent to the modem system 124 of FIG. 6. Although the base station 146 as shown in FIG. 7 includes only the modem systems 148(1)-148(8), it should be appreciated that the base station 146 can be scaled up or down to include more or less than the modem systems 148(1)-148(8).

Those skilled in the art will recognize improvements and modifications to the preferred embodiments of the present disclosure. All such improvements and modifications are considered within the scope of the concepts disclosed herein and the claims that follow.

What is claimed is:

1. A millimeter wave (mmWave) power head comprising:
   a signal input coupled to a wired communication medium and configured to receive a multiplexed signal comprising a communication signal at an intermediate frequency (IF) frequency and a pilot signal at a base frequency;
   filter circuitry coupled to the signal input and configured to demultiplex the multiplexed signal to separate the communication signal and the pilot signal;
   a plurality of multiplication paths configured to multiply the pilot signal to generate a plurality of local oscillator (LO) clock signals at a plurality of harmonic frequencies relative to the base frequency of the pilot signal, respectively; and
   at least one mixer circuit coupled to a selected multiplication path among the plurality of multiplication paths and configured to upconvert the communication signal from the IF frequency to an mmWave carrier frequency based on a selected LO clock signal generated by the selected multiplication path.

2. The mmWave power head of claim 1 wherein the base frequency of the pilot signal is at least ten times higher than a crystal oscillator (XTAL) reference clock associated with a phase locked loop (PLL) frequency synthesizer.

3. The mmWave power head of claim 1 further configured to receive a control signal at a frequency below three hundred megahertz via the wired communication medium.

4. The mmWave power head of claim 1 wherein the selected multiplication path is configured to generate the selected LO clock signal at a selected LO reference frequency higher than the mmWave carrier frequency to enable a high-side injection of the selected LO clock signal.

5. The mmWave power head of claim 1 further comprising a transmit phase shifter coupled to the selected multiplication path and a plurality of mixer circuits coupled to the transmit phase shifter, wherein:
   the transmit phase shifter is configured to phase shift the selected LO clock signal generated by the selected multiplication path to generate a plurality of phase-coherent LO clock signals; and
   the plurality of mixer circuits is configured to upconvert the communication signal based on the plurality of phase-coherent LO clock signals to generate a plurality of phase-coherent mmWave RF signals at the mmWave carrier frequency, respectively.

6. The mmWave power head of claim 5 wherein the plurality of mixer circuits is coupled to a plurality of antennas configured to transmit the plurality of phase-coherent mmWave RF signals in an RF beam.

7. The mmWave power head of claim 1 wherein the filter circuitry comprises:
   a first filter configured to pass the communication signal at the IF frequency and reject the pilot signal at the base frequency; and
   a second filter configured to pass the pilot signal at the base frequency and reject the communication signal at the IF frequency.

8. The mmWave power head of claim 7 wherein each of the first filter and the second filter is an acoustic filter selected from the group consisting of: a surface acoustic wave (SAW) filter; a bulk acoustic wave (BAW) filter; and a film bulk acoustic resonator (FBAR) filter.

9. The mmWave power head of claim 1 wherein each of the plurality of multiplication paths comprises:
   a clock multiplier configured to multiply the pilot signal to generate a respective LO clock signal among the plurality of LO clock signals at a respective harmonic frequency among the plurality of harmonic frequencies; and
   a bandpass filter configured to pass the respective LO clock signal and reject noises associated with the respective LO clock signal.

10. The mmWave power head of claim 9 wherein the bandpass filter in each of the plurality of multiplication paths is a transmission line filter.

11. The mmWave power head of claim 1 wherein the at least one mixer circuit is further configured to downconvert the communication signal from the mmWave carrier frequency to the IF frequency based on the selected LO clock signal generated by the selected multiplication path.

12. The mmWave power head of claim 1 wherein the plurality of multiplication paths comprises at least two multiplication paths.

13. A modem system comprising:
   a radio frequency (RF) baseband circuit; and
   a plurality of mmWave power heads coupled to the RF baseband circuit via a plurality of wired communication mediums, respectively;
   wherein each mmWave power head among the plurality of mmWave power heads comprises:
      a signal input coupled to a wired communication medium among the plurality of wired communication mediums and configured to receive a multiplexed signal comprising a communication signal at an intermediate frequency (IF) frequency and a pilot signal at a base frequency;
      filter circuitry coupled to the signal input and configured to demultiplex the multiplexed signal to separate the communication signal and the pilot signal;
      one or more multiplication paths configured to multiply the pilot signal to generate one or more local oscillator (LO) clock signals at one or more harmonic frequencies relative to the base frequency of the pilot signal, respectively; and
      at least one mixer circuit coupled to a selected multiplication path among the one or more multiplication paths and configured to upconvert the communication signal from the IF frequency to an mmWave carrier frequency based on a selected LO clock signal generated by the selected multiplication path.

14. The modem system of claim 13 wherein each mmWave power head among the plurality of mmWave power heads is coupled to the RF baseband circuit via a single coaxial cable.

15. The modem system of claim 13 wherein each mmWave power head among the plurality of mmWave power heads further comprises a transmit phase shifter coupled to the selected multiplication path and a plurality of mixer circuits coupled to the transmit phase shifter, wherein:
the transmit phase shifter is configured to phase shift the selected LO clock signal generated by the selected multiplication path to generate a plurality of phase-coherent LO clock signals; and
the plurality of mixer circuits is configured to upconvert the communication signal based on the plurality of phase-coherent LO clock signals to generate a plurality of phase-coherent mmWave RF signals at the mmWave carrier frequency, respectively.

16. The modem system of claim 15 wherein the plurality of mixer circuits is coupled to a plurality of antennas configured to transmit the plurality of phase-coherent mmWave RF signals in an RF beam.

17. The modem system of claim 13 wherein the filter circuitry comprises:
a first filter configured to pass the communication signal at the IF frequency and reject the pilot signal at the base frequency; and
a second filter configured to pass the pilot signal at the base frequency and reject the communication signal at the IF frequency.

18. The modem system of claim 13 wherein each of the one or more multiplication paths comprises:
a clock multiplier configured to multiply the pilot signal to generate a respective LO clock signal among the one or more LO clock signals at a respective harmonic frequency among the one or more harmonic frequencies; and
a bandpass filter configured to pass the respective LO clock signal and reject noises associated with the respective LO clock signal.

19. The modem system of claim 13 wherein the at least one mixer circuit is further configured to downconvert the communication signal from the mmWave carrier frequency to the the IF frequency based on the selected LO clock signal generated by the selected multiplication path.

20. The modem system of claim 13 wherein for each of the plurality of mmWave power heads, the RF baseband circuit is configured to:
generate the pilot signal at the base frequency that is at least ten times higher than a crystal oscillator (XTAL) reference frequency for a phase locked loop (PLL) frequency synthesizer;
multiplex the communication signal at the IF frequency and the pilot signal at the base frequency to generate the multiplexed signal; and
provide the multiplexed signal to the mmWave power head over the wired communication medium coupled to the mmWave power head among the plurality of wired communication mediums.

* * * * *

UNITED STATES PATENT AND TRADEMARK OFFICE
CERTIFICATE OF CORRECTION

PATENT NO.         : 10,374,788 B2
APPLICATION NO.    : 15/678729
DATED              : August 6, 2019
INVENTOR(S)        : Dirk Robert Walter Leipold, George Maxim and Baker Scott Page 1 of 1

It is certified that error appears in the above-identified patent and that said Letters Patent is hereby corrected as shown below:

In the Specification

In Column 8, Line 23, replace "IF frequency $F_F$" with --IF frequency $F_{IF}$--.

In Column 9, Line 5, replace "IF frequency $F_F$" with --IF frequency $F_{IF}$--.

In Column 10, Line 9, replace "IF frequency $F_F$" with --IF frequency $F_{IF}$--.

Signed and Sealed this
Seventeenth Day of September, 2019

Andrei Iancu
*Director of the United States Patent and Trademark Office*